United States Patent [19]

Babjak et al.

[11] Patent Number: 4,957,543
[45] Date of Patent: Sep. 18, 1990

[54] METHOD OF FORMING NICKEL FOAM

[75] Inventors: Juraj Babjak; Victor A. Ettel; Vladimir Paserin, all of Mississauga, Canada

[73] Assignee: Inco Limited, Toronto, Canada

[21] Appl. No.: 368,193

[22] Filed: Jun. 16, 1989

[51] Int. Cl.$^5$ ............................ C22B 5/20; B22F 1/00
[52] U.S. Cl. ...................................... 148/13; 428/614; 429/235; 75/415
[58] Field of Search ........................... 75/20 F; 419/2; 428/614; 429/235

[56] References Cited

U.S. PATENT DOCUMENTS

| | | | |
|---|---|---|---|
| 2,986,115 | 5/1961 | Toulmin, Jr. | 118/48 |
| 3,075,494 | 1/1963 | Toulmin, Jr. | 118/49.5 |
| 3,111,396 | 11/1963 | Ball | 75/20 F |
| 3,160,517 | 12/1964 | Jenkin | 117/93.3 |
| 3,213,827 | 10/1965 | Jenkin | 118/49.5 |
| 3,769,086 | 10/1973 | Schladitz | 117/228 |
| 3,877,987 | 4/1975 | Gutjahr et al. | 136/29 |
| 3,900,646 | 8/1975 | Clyde | 427/55 |
| 4,251,603 | 2/1981 | Matsumoto et al. | 429/94 |
| 4,443,526 | 4/1984 | Jackovitz et al. | 429/223 |
| 4,687,702 | 8/1987 | Nibsees | 428/308.4 |
| 4,761,323 | 8/1988 | Muhlratzer et al. | 428/198 |

FOREIGN PATENT DOCUMENTS

| | | |
|---|---|---|
| 101681 | 8/1983 | European Pat. Off. |
| 151064 | 8/1985 | European Pat. Off. |
| 128543 | 11/1978 | Japan |
| 17977 | 2/1979 | Japan |
| 123942 | 8/1982 | Japan |
| 263974 | 11/1987 | Japan |

OTHER PUBLICATIONS

Nickel—Jun. 1988, *Nickel Foam Metal Continues to Find New Applications Beyond Reach of Most Metals,* Dr. Gen-ichi Nakazawa.

Journal of Applied Electrochemistry—Oct. 21, 1987, *Flow-Through and Flow-By Porous Electrodes of Nickel Foam,* I. Material Characterization, S. Langlois & F. Coeuret.

Non-Nuclear Energy Technology, Jun. 1981, *Development of Gas Phase Metallized Plaques for Electrodes of Storage Batteries, in Particular for Nickel Oxide Electrodes,* R. Linkohr and H. Schladitz, Rpt. #: BMFT-F-B-T 31-053.

Primary Examiner—Melvyn J. Andrews
Attorney, Agent, or Firm—Francis J. Mulligan, Jr.; Edward A. Steen; Blake T. Biederman

[57] ABSTRACT

The invention provides a nickel foam and a method of forming a nickel foam for a nickel containing battery. An open-cell foam structure is placed in a nickel carbonyl gas containing structure. The foam structure is heated to a temperature at which nickel carbonyl decomposes. Nickel from the nickel carbonyl gas decomposes on the foam structure to form a nickel plated foam structure. The nickel plated foam structure is then sintered leaving an open-cell nickel network to form the nickel foam. The open-cells of the nickel foam comprise substantially hollow wires having a substantially uniform transverse cross-section. The nickel foam is further characterized by the conductivity through the nickel foam multiplied by a factor of 3.4 being equal to or greater than the theoretical conductivity of nickel.

9 Claims, 6 Drawing Sheets

X - NICKEL FOAM OF THE INVENTION
■ - ELECTROCHEMICAL NICKEL FOAM
— 1/3 THEORETICAL CONDUCTIVITY

METHOD OF FORMING NICKEL FOAM

The invention relates to the field of nickel foams. More particularly, the invention relates to nickel foam battery plaques having improved conductivity, porosity, foam cell size, capacity to hold active mass, strength and a method for producing the improved battery plaques.

BACKGROUND OF THE INVENTION AND PROBLEM

Battery plaques have conventionally been formed by sintering nickel powder onto a coated steel plate. Porosities achieved in the sintered plaque have been generally limited to porosities in the 80% range. These 80% range porosities, in turn, limit the amount of active mass that may be held in the plaque which limits the battery capacity. Low porosity and decreased capacity for holding active mass has long been a problem limiting the battery performance.

Nickel plaques having increased porosity for batteries have been experimentally formed by chemical vapor deposition of nickel carbonyl on carbon felt. The battery plaques were formed by depositing nickel onto a carbon felt substrate and using the nickel coated felt substrate to support active mass. There are several problems with the carbon felt process. First, carbon felt is relatively expensive for the manufacture of batteries; second, the cell size of felt structures varies widely within the felt itself and is difficult to control for fibrous, felt-type structures; third, the carbon felt substrate remains in the battery; and fourth, the process was not satisfactory for polymer coated felts. Previous experimental attempts at chemical vapor deposition of polymer fibers for batteries produced a product having an inferior nickel coating having inferior mechanical stability which was unsuitable for battery plaques.

Recently, in an attempt to overcome the low porosity problem, nickel battery plaques have been produced by an alternative electrochemical method (Matsamoto U.S. Pat. No. 4,251,603). Nickel is electroplated onto a polyurethane foam and sintered to form nickel foam. Before plating may be conducted, polyurethane foam is made conductive by immersion of the foam into a colloidal graphite dispersion and drying the foam. This nickel foam has increased porosity for increasing the amount of active mass battery plaques can support.

Nickel foam, formed by electrochemical technique, has been produced by Sumitomo Electric Industries under the name CELMET TM and by SORAPEC under the name METAPORE TM. The CELMET TM nickel foam has a highly irregular surface when magnified about 100 times. The electrical conductivity of the electrodeposited nickel foam is lower than the expected conductivity as a function of porosity due to the intrinsic structure of the electroplated nickel layer. The poorer conductivity effects battery output, recharging rates and battery overheating during recharging.

Additionally, electrochemically plated nickel foam had less than ideal mechanical properties at high porosities. These lower mechanical properties at higher porosities limit the amount of active mass that may be reliably used in a battery without premature battery failure. A battery plaque formed with electrochemical nickel foam having too high a porosity would cause the plaque to have weak mechanical properties.

It is an object of this invention to produce a nickel foam having improved conductivity.

It is a further object of this invention to produce a nickel foam having improved mechanical properties at higher porosity levels.

It is a further object of this invention to produce a nickel foam having a smaller pore size and more uniform structure for improved battery performance.

It is a further object of this invention to provide an effective method of forming nickel foams with the above improved properties.

SUMMARY OF THE INVENTION

The invention provides a method of forming nickel foam. An open-cell foam structure of thermally decomposable material is placed in an atmosphere containing nickel carbonyl gas. The foam structure is heated to a temperature at which the nickel carbonyl gas decomposes. Nickel from the nickel carbonyl gas is decomposed on the foam structure to form a nickel plated foam structure. The nickel plated foam structure is then sintered to remove the foam structure from the nickel plated foam structure leaving an isotropic, open-cell network of interconnected nickel wires to form the nickel foam.

In addition, the invention provides a battery plaque of interconnected open-pore cells. The open-pore cells are comprised of substantially hollow nickel wires having a substantially uniform cross-section. Conductivity through the nickel structure is characterized by actual conductivity across the reticulated nickel network multiplied by a factor of 3.4 being about equal to or greater than the theoretical conductivity of nickel.

PARTICULAR DESCRIPTION OF THE INVENTION

Figure 1:
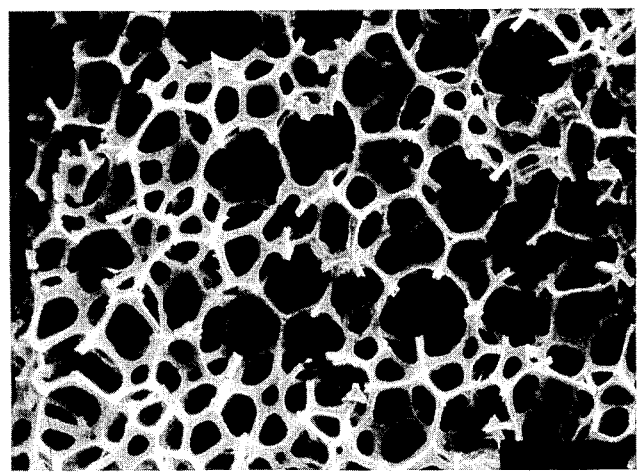
FIG. 1 is a scanning electron microscope (SEM) photomicrograph of a transverse cross-section of a nickel carbonyl plated foam magnified 30 times.

Referring to FIG. 1, the reticulated open-cell structure of the invention is continuous and uniform. The uniform structure is a result of decomposition of nickel carbonyl vapor onto a reticulated or open-cell foam. The nickel coated foam is then sintered to "burn off" the enclosed foam, leaving an isotropic network of open nickel cells known as nickel foam. It has been discovered that battery plaques formed by the method of the invention have superior properties over battery plaques formed by sintering and electrochemical techniques. Theoretically, energy requirements for nickel foam produced by chemical vapor deposition are less than the energy requirements for electrochemical deposition of nickel.

Figure 2:
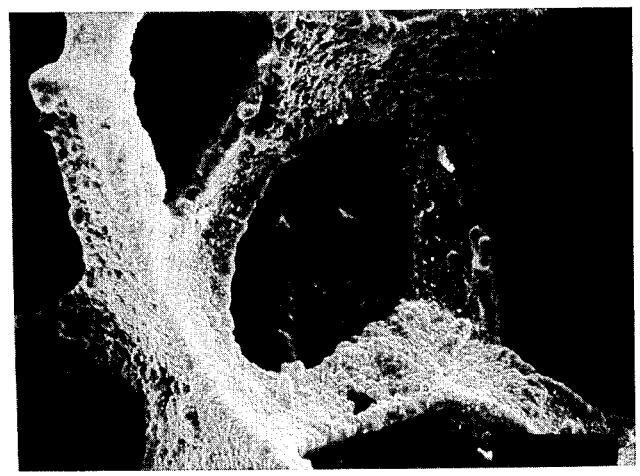
FIG. 2 is a SEM photomicrograph of the cell structure of electrochemically deposited nickel foam at 150 times magnification.
Figure 3:
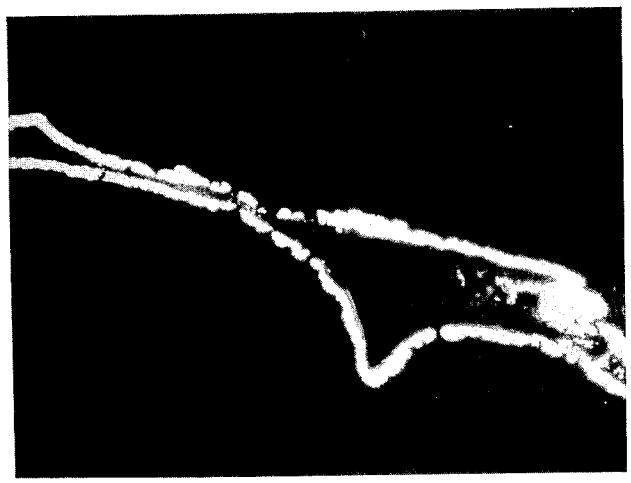
FIG. 3 is a SEM photomicrograph of a cross-section of electrochemically deposited nickel foam at 150 times magnification.
Figure 4:
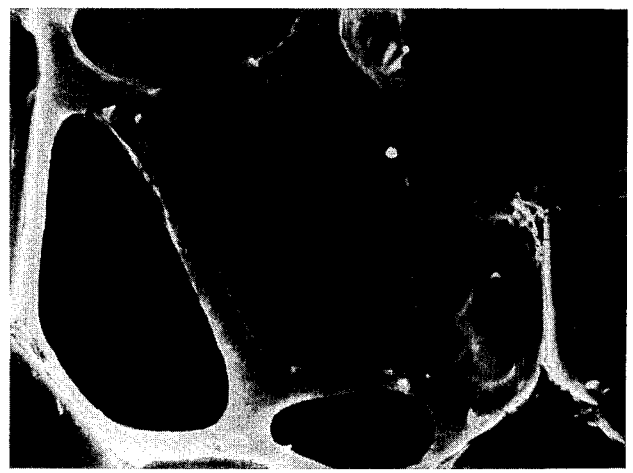
FIG. 4 is a SEM photomicrograph of the cell structure of nickel carbonyl deposited nickel foam at 150 times magnification.
Figure 5:
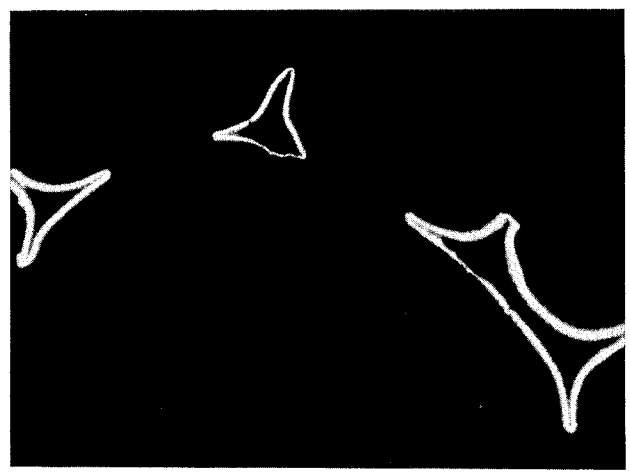
FIG. 5 is a SEM photomicrograph of a cross-section of nickel carbonyl deposited nickel foam at 150 times magnification.

Improvements of the invention are dramatically illustrated by comparing electrochemically deposited nickel foam of FIGS. 2 and 3 to nickel foam of the invention of FIGS. 4 and 5. FIG. 2 illustrates an irregular, bumpy, nodular deposit of nickel. These nodules of nickel and especially weaker points connecting the nodules, are suspected to create areas of inefficient electrical conductivity which increase the internal resistance of the battery plaque. Additionally, FIG. 3 illustrates actual discontinuities or holes within the nickel conductor wire of the nickel foam. These holes and especially weak points connecting the nodules, are also suspected of causing inefficient conductivity in battery plaques. Additionally, it is believed that this irregular shape of the electrochemical deposit contributes to mechanical weakness of the nickel foam. By contrast, FIGS. 4 and 5 illustrate a continuous smooth uniform deposit without any visible holes. The nickel carbonyl deposit of the invention has been proven to have unexpectedly improved qualities. The nickel carbonyl deposited nickel foam has both improved conductivity and improved mechanical properties. This improved conductivity and improved mechanical properties should facilitate a significant improvement in battery performance by lowering internal battery resistance, and increasing the amount of active mass a plaque will hold in a battery without mechanical failure.

Figure 6:
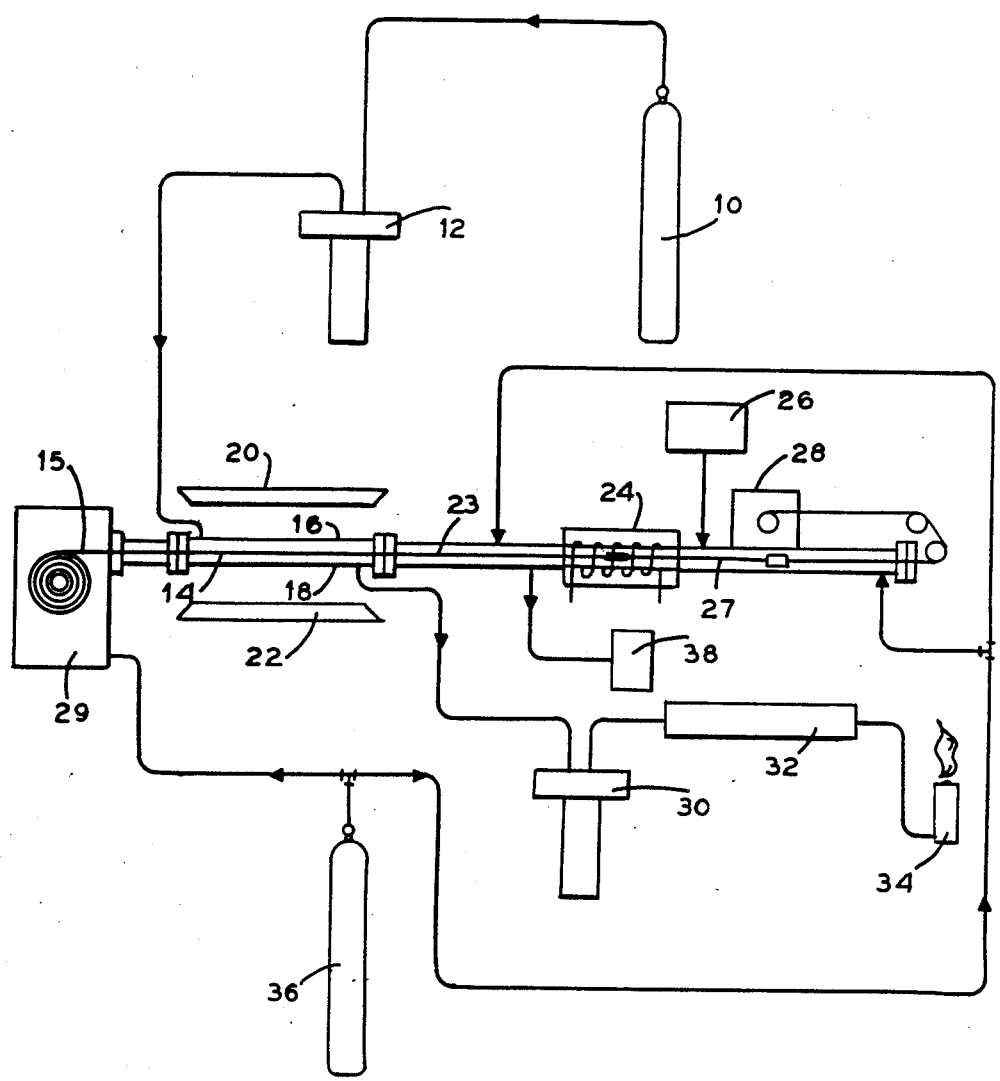
FIG. 6 is a schematic drawing of an apparatus for producing nickel foam by decomposing nickel carbonyl onto foam and sintering the coated foam.

Referring to FIG. 6, the apparatus set up for coating foam with nickel carbonyl initially appears to be fairly simple. A carbon monoxide supply 10 feeds carbon monoxide gas to nickel carbonyl ($Ni(CO)_4$) supply autoclave 12. $Ni(CO)_4$ gas in nickel carbonyl supply autoclave is maintained at a desired temperature from about 10° C. to about 38° C. Feed gas concentration resulting from pick-up of nickel carbonyl in carbon monoxide ranges from about 20 to about 90 percent nickel carbonyl by volume and from about 10 to about 80 percent carbon monoxide by volume. $Ni(CO)_4$ gas from autoclave 12 enters the coating chamber 14. Optionally, $H_2S$ gas or another catalyst may be added to the coating chamber 14 to promote nickel plating.

The coating chamber 14 is supplied with continuous strips of foam 15. The foam 15 utilized may be any reticulated or open-pore foam. The reticulated foam may be polyurethane, polystyrene, polyvinylchloride, polyethelene, polyiocyanurates, polyphenols or polypropylene. Preferably, reticulated polyurethane foam is supplied to the coating chamber. Polyurethane has proven effective despite having a melting temperature only slightly higher than the decomposition temperature of nickel carbonyl. Polyvinylchloride foam would be the least desirable, because of problems of treating exhaust gases formed during the sintering step.

The chamber 14 is horizontally mounted, having two windows 16 and 18 constructed of Teflon TM polymer, Pyrex TM glass or quartz. The windows 16 and 18 form essentially infrared radiation transparent windows for allowing radiation to enter the coating chamber 14 from infrared sources 20 and 22 having parabolic reflector. The infrared radiation penetrates the windows 16 and 18 to selectively heat the foam 15 to a temperature at which nickel carbonyl decomposes without heating the chamber or gases inside the chamber to a temperature at which $Ni(CO)_4$ decomposes. The nickel carbonyl decomposes on the foam 15 to form a substantially uniform deposit. Other alternative means for heating the foam 15 include induction heating and resistance heating of foams having or treated to have at least partial electrical conductivity.

Polyurethane foam has infrared absorption peaks between 3.0 and 3.7 $\mu$m with a very strong absorption at 5.7 $\mu$m. Nickel carbonyl has a strong absorption between 4.8 and 4.9 $\mu$m and carbon monoxide has a strong absorption between 4.5 and 4.8 $\mu$m. This closeness in absorption peaks can cause problems in selectively heating foam in coating chamber 14. The problem is spontaneous decomposition of the $Ni(CO)_4$ in chamber 14 without plating nickel on the foam 15 to form nickel plated foam 23. Heating potential of radiators 20 and 22 is controlled by a variable voltage regulator when radiators 20 and 22 are electrically powered. The voltage is adjusted to a voltage at which the radiators emit most energy at wavelengths below 2.5 $\mu$m. When polyurethane foam is used, the radiation must also not overheat the polyurethane. Intensity of infrared radiators 20 and 22 at the windows 16 and 18 has been about 1 watt per square centimeter. If the polyurethane is overheated it will decompose in the coating chamber 14. Wavelengths below 2.5 $\mu$m also effectively heat the nickel plated foam 23, since the nickel continues to decompose onto the nickel of nickel plated foam 23 without any significant decrease in decomposition rate. If available, use can be made of radiation filters external of chamber 14 which selectively absorb radiation of 4.5 to 4.9 $\mu$m wavelength.

Polyurethane foam is first coated with a material for absorption of infrared radiation that is weakly absorbed by nickel carbonyl and carbon monoxide, such as carbon black, before it enters the coating chamber 14. Alternatively, pigments may be incorporated directly into the foam itself to promote absorption of infrared radiation. Grey colored polyurethane foam has been successfully coated, however if the foam is too light in color, the foam is not effectively heated with infrared sources 20 and 22. Infrared sources 20 and 22 then supply infrared radiation with wavelengths primarily below 2.5 $\mu$m. Preferably, the infrared radiation is supplied at wavelengths primarily below 2.0 $\mu$m. This range of wavelengths effectively heats the foam 15 without causing any spontaneous decomposition of the nickel carbonyl gas. Nickel carbonyl decomposes uniformly on the carbon black coated foam 15 plating first from the center of the foam 15. Coating chamber 14 is horizontally mounted. There is a $Ni(CO)_4$ concentration gradient in the coating chamber 14. For this reason, the top and bottom infrared sources 20 and 22 may be adjusted to different settings to correct for any $Ni(CO)_4$ concentration gradients by heating one side of foam 15 slightly hotter than the other. Also, it is important to avoid any uneven gas flow patterns of concentrated nickel carbonyl. These uneven gas flow patterns will also tend to deposit heavier in some areas. Alternatively, the coating chamber 14 may be positioned vertically. Vertical mounting of coating chamber 14 should facilitate a more uniform gas distribution on both sides of the foam 15.

The nickel plated foam 23 is then transported to the furnace 24. Furnace 24 may be either openly connected to combustion chamber 14 for continuous operations, as illustrated, or be separately attached for batch-type operations. The furnace 24 is maintained in a reducing condition with hydrogen gas. The furnace 24 may be of any known type such as resistance, induction, or any suitable externally heated, fuel-type furnaces. Furnace 24 is supplied with a reducing gas 26 such as hydrogen gas to prevent oxidation of nickel foam 27. The nickel plated foam 17 is heated to a temperature between 850° C. and 900° C. in furnace 24. The polyurethane decomposes, leaving a reticulated network of substantially hollow nickel wires or nickel foam 27. The gases resulting from evaporation of the polyurethane foam escape from the network of wire. A portion of the foam 15 may remain within the nickel foam 27. However, it is preferred that the foam 15 is completely removed. The gases are believed to escape through small, unseen holes in the network or perhaps the gases escape partially by diffusion. When foam 15 is plated using $H_2S$ gas catalyst, sulfur deposited in the nickel during this step is effectively removed from the nickel foam 27 in the furnace 24. Nickel foam 27 may shrink during annealing, however, nickel foam 27 having a porosity less than 96 percent does not shrink appreciably when heated at 850° C. In addition, the nickel foam 27 at temperatures between 850° C. and 900° C. anneals, greatly improving the mechanical properties of nickel foam 27. After annealing, nickel foam 27 may be rolled on a collection spool 28. Nickel foam 27 from the collection spool 28 may be rolled to desired thickness and cut to size for forming battery plaques. If desired, nickel foam 27 may be first annealed under oxidizing conditions and then under reducing conditions. This sequence may be necessary when using a more stable polymeric substrate.

Tension between collection spool 28 and supply spool 29 may be used to stretch cells of foam 15. Collection spool 28 is pulled at a constant rate by a direct current motor (Experimental rates have pulled foam 15 at rates between 50 and 100 cm/hr). Nickel foam 27 formed from stretched foam 15 will have elongated cells and tend to have anisotropic properties. These anisotropic properties may be used to increase strength or conductivity in a preferred direction.

In the illustrated configuration of the invention, exhaust gases from the coating chamber 14 travel first to a condenser autoclave 30 maintained by dry ice at −80° C. to condense and freeze nickel carbonyl. Exhaust gases then pass on to a high temperature secondary decomposer 32 maintained at 280° C. to further remove remaining $Ni(CO)_4$. Exhaust gases from the secondary decomposer 32 are then burned with burner 34 to insure complete removal of the $Ni(CO)_4$. Also, nitrogen from nitrogen supply 36 is supplied at a positive pressure to the entrance of foam 15 and exit of nickel foam 27 to insure $Ni(CO)_4$ does not leak from the system. A nitrogen gas purge is also connected to the furnace exit to prevent the escape of hydrogen gas. Exhaust gases from the furnace are released through exit 38.

Cell size of the battery plaque is controlled initially by the cell size of the foam. A foam of greater cell size than the final cell is required to compensate for shrinkage during heating of the foam and annealing of the nickel foam. Preferentially, the average distance across open-pore cells of the battery plaque is between 400 $\mu$m and 20 $\mu$m. More preferentially, the average distance across the open-pore cell is between 100 $\mu$m and 60 $\mu$m. The smaller cell size increases surface area of the battery plaque and decreases the distance that electrons travel between the active mass and the battery plaque, but allows nickel hydroxide to be pushed freely into the plaque. If the size of the cells decreases substantially more, it could be difficult to squeeze nickel hydroxide particles into the plaque since the size of nickel hydroxide particles is typically on the order of about 10 $\mu$m.

A battery plaque having a cell size between 400 and 20 $\mu$m may be created by either plating a compressed foam having a very small cell size or by simply rolling a nickel foam of larger size to reduce the cell size. The preferred method of producing the cells is to directly coat foam having a small cell size such as compressed polyurethane foam. The rolling of nickel foam is a simple way to decrease cell size, however, in rolling nickel foam, cell size is decreased at the expense of porosity. Additionally, rolling of battery plaques will not deform in a completely uniform manner causing disparities in the shape and size of cells across the battery plaque. The process of the invention avoids the need to roll nickel foam to decrease cell size.

To test conductivity of the samples, copper clamps were attached to opposing ends of rectangular nickel foam samples. Conductivity along the length of the foam was calculated by the formula:

$$\sigma_f = \frac{Il}{Vwt}$$

where
$\sigma_f$ = Nickel foam conductivity
V = measured voltage in volts
w = sample width in cm
t = sample thickness in cm
l = distance between probes
I = current in amperes Cell size of the battery plaque is controlled initially by the cell size of the foam. A foam of greater cell size than the final cell is required to compensate for shrinkage during heating of the foam. Table 1 below provides a summary of conductivity comparing electrochemical nickel foams to nickel foams of the invention of various porosities.

TABLE 1

Figure 7:
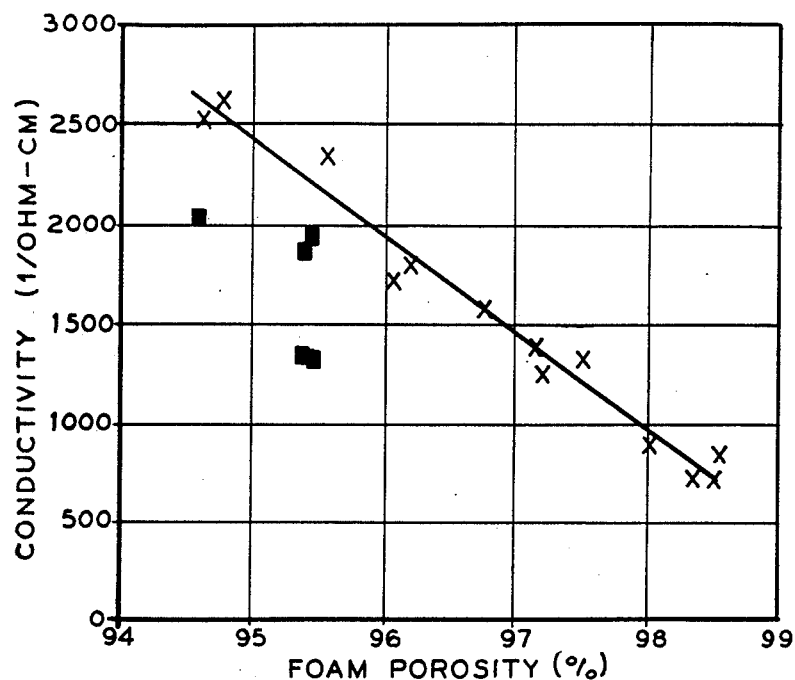
FIG. 7 is a graph of conductivity versus porosity for electrochemically plated nickel foam and the nickel foam of the invention.

The conductivity of the nickel foam of the invention as a function of porosity (Samples 1–13) was substantially greater than the electrochemically deposited CELMET TM product of Sumitomo (Samples 14–18). The data from Table 1 are illustrated in FIG. 7, where the electrochemical nickel foam has a significantly lower conductivity than nickel foam of the invention at a similar porosity. This increased performance satisfied the conductivity of a model having one third of its wires conducting in the x, y and z directions, unlike nickel foam formed from electrochemically deposited foam. Conductivity of the nickel foam of the invention was found to satisfy the equation:

$$\sigma_{Ni} = \frac{\sigma_f(3)}{(1 - P)}$$

where
$\sigma_{Ni}$ = accepted conductivity of bulk nickel
$\sigma_f$ = apparent conductivity of nickel foam
P = porosity of nickel foam This relationship is satisfied by the nickel foam produced by the method of this invention. In calculation of theoretical conductivity of nickel foam of the invention, the accepted value of $1.46 \times 10^5$ ohm$^{-1}$ cm$^{-1}$ was used for $\sigma_{Ni}$ (*CRC Hand book of Chemistry and Physics* 68$^{th}$ Edition). A factor of 3.4 multiplied by the theoretical conductivity and corrected for porosity satisfies the experimental data of the nickel foam of the invention. A factor of 3.2 satisfies most nickel foams of the invention. The plotted factor of 3 appears to effectively predict the relationship between porosity and conductivity for the nickel foam of the invention.

tween clamps) and a variable thickness which varied with the samples. The samples were 1 cm wide in the neck (4.6 cm in length) and tapered at each end over a length of 1.6 cm to 2.0 cm in width. This standardized sample was a modification of ASTM D 412-83 Die C used for rubber testing. This standard was modified by increasing the width at the neck of the sample to 1.0 cm.

The samples were pulled at a constant rate of 0.13 mm/sec until the sample fractured. Only samples in which the sample fractured in the neck region were

TABLE 1

NICKEL FOAM CONDUCTIVITY

| SAMPLE NUMBER | LENGTH (cm) | WIDTH (cm) | THICKNESS (cm) | MASS (g) | DENSITY (g/cm$^2$) | POROSITY (%) | CONDUCTIVITY (1/Ohm-cm) | THEORETICAL 1/3 CONDUCTIVITY (1/Ohm-cm) |
|---|---|---|---|---|---|---|---|---|
| 1 | 5 | 1 | 0.15 | 0.5055 | 0.481 | 94.59 | 2528.2 | 2636.1 |
| 2 | 5 | 1 | 0.15 | 0.1723 | 0.177 | 98.01 | 898.0 | 967.6 |
| 3 | 5 | 1 | 0.15 | 0.4112 | 0.397 | 95.54 | 2352.4 | 2175.4 |
| 4 | 5 | 1 | 0.15 | 0.1471 | 0.140 | 98.43 | 756.1 | 767.1 |
| 5 | 5 | 1 | 0.15 | 0.2863 | 0.252 | 97.16 | 1394.4 | 1382.4 |
| 6 | 5 | 1.15 | 0.15 | 0.1445 | 0.129 | 98.55 | 856.0 | 705.7 |
| 7 | 5 | 1 | 0.15 | 0.2597 | 0.247 | 97.22 | 1265.7 | 1354.3 |
| 8 | 5 | 1 | 0.19 | 0.1498 | 0.149 | 98.33 | 730.7 | 814.5 |
| 9 | 5 | 1.05 | 0.17 | 0.2816 | 0.222 | 97.50 | 1328.5 | 1216.7 |
| 10 | 5 | 1 | 0.08 | 0.2621 | 0.468 | 94.74 | 2624.0 | 2562.8 |
| 11 | 1.6 | 1.45 | 0.145 | 0.1209 | 0.290 | 96.74 | 1593.1 | 1590.2 |
| 12 | 4.7 | 2.1 | 0.125 | 0.4473 | 0.339 | 96.19 | 1810.7 | 1855.0 |
| 13 | 4.7 | 2.05 | 0.145 | 0.5262 | 0.351 | 96.06 | 1726.5 | 1919.4 |
| 14 | 5 | 1 | 0.15 | 0.5072 | 0.483 | 94.57 | 2045.3 | 2645.0 |
| 15 | 5 | 1.1 | 0.16 | 0.503 | 0.403 | 95.48 | 1336.3 | 2204.1 |
| 16 | 5 | 1.08 | 0.16 | 0.48 | 0.408 | 95.41 | 1345.0 | 2236.8 |
| 17 | 4.7 | 2.18 | 0.16 | 0.7231 | 0.411 | 95.39 | 1686.9 | 2247.8 |
| 18 | 4.7 | 2.12 | 0.16 | 0.6951 | 0.408 | 95.42 | 1942.7 | 2230.8 |

CELMET TM and METAPORE TM products require a factor of 4, which demonstrates their relatively high resistance. The factor of 4 for CELMET TM was determined by the experimented data of TABLE 1 and the factor of 4 for METAPORE TM was published in S. Langlois and F. Coeuret, *Flow-through and flow-by porous electrodes of nickel foam. I. Material characterization.*, 19 Journal of Applied Electrochemistry 43, 43–50 (1989). Increasing conductivity of the nickel foam of the invention lowers the internal resistance of the battery plaque. The lower resistance contributes to allowing quicker recharging rates and lowering battery overheating during recharging.

The tensile strength of nickel foam of the invention also was superior to that of electrochemically produced nickel foam. A die was used to cut samples of nickel foam to standard dimensions. The samples were dumbbell shaped, having a total length of 11 cm (8 cm beaccepted as being valid. The data for the tests was as follows:

TABLE 2

Figure 8:
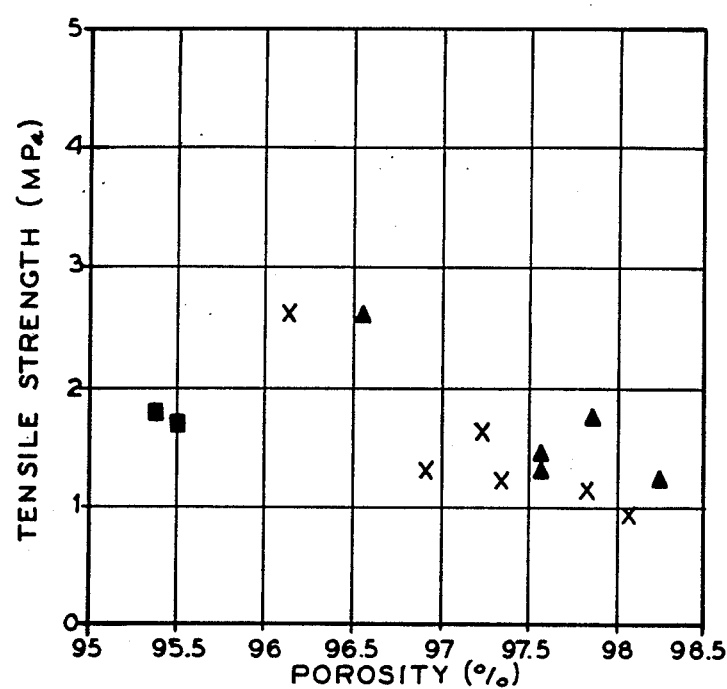
FIG. 8 is a graph of ultimate tensile strength versus porosity for electrochemically plated nickel foam and the nickel foam of the invention.

Sample numbers 1–12 correspond to nickel foam produced by the process of the invention. Sample numbers 12 and 13 correspond to electrochemically produced CELMET TM nickel foams. Referring to FIG. 8, a graph of Table 2, it is readily apparent that nickel foam of the invention has improved mechanical properties.

TABLE 2

ULTIMATE TENSILE STRENGTH

| Sample Number | Pores per Linear (cm) | Thickness (mm) | Mass (g) | Porosity (%) | Density (g/cm$^3$) | Fracture Strength (N) | Initial Apparent Cross Section (mm$^2$) | Stress at Fracture (N/cm$^2$) | Stress at Fracture (MPa) |
|---|---|---|---|---|---|---|---|---|---|
| 1 | 31.5 | 0.5 | 0.2534 | 96.538 | 0.308 | 13.13 | 5 | 262.6 | 2.63 |
| 2 | 23.6 | 1.1 | 0.6253 | 96.117 | 0.346 | 28.67 | 11 | 260.6 | 2.61 |
| 3 | 23.6 | 1.05 | 0.4759 | 96.904 | 0.276 | 14.03 | 10.5 | 133.6 | 1.34 |
| 4 | 23.6 | 1.2 | 0.4668 | 97.343 | 0.236 | 14.92 | 12 | 124.3 | 1.24 |
| 5 | 23.6 | 1.35 | 0.5461 | 97.237 | 0.246 | 22.27 | 13.5 | 165.0 | 1.65 |
| 6 | 23.6 | 1.2 | 0.3426 | 98.050 | 0.174 | 11.67 | 12 | 97.3 | 0.97 |
| 7 | 23.6 | 1.15 | 0.3659 | 97.827 | 0.193 | 13.2 | 11.5 | 114.8 | 1.15 |
| 8 | 31.5 | 1.9 | 0.6775 | 97.564 | 0.217 | 25.28 | 19 | 133.1 | 1.33 |
| 9 | 31.5 | 1.95 | 0.6982 | 97.554 | 0.218 | 28.2 | 19.5 | 144.6 | 1.45 |
| 10 | 31.5 | 1.95 | 0.6147 | 97.847 | 0.192 | 34.14 | 19.5 | 175.1 | 1.75 |
| 11 | 31.5 | 1.65 | 0.426 | 98.237 | 0.157 | 20.55 | 16.5 | 124.5 | 1.25 |
| 12 | 23.6 | 1.63 | 0.9436 | 95.499 | 0.401 | 27.9 | 16.3 | 171.2 | 1.71 |
| 13 | 23.6 | 1.6 | 0.949 | 95.388 | 0.410 | 28.55 | 16 | 178.4 | 1.78 |

These mechanical properties are important because battery plaques are wound to fit within a battery housing. A battery plaque must have sufficient strength to be deformed and continue to hold an active mass such as a paste containing nickel hydroxide particles. Nickel foam from electrochemical nickel foam had an ultimate tensile strength of 1.754 MPa with a porosity of about 95.5 percent. The ultimate tensile strength of pure nickel bars is about 317 MPa. However, sample from the method of the invention had similar strengths with porosities as high as nearly 98 percent. This increase in mechanical properties allows a higher amount of active mass to be reliably held by the battery plaque having the same strength as the electrochemical nickel foam. The tensile strength of nickel foam of the invention corrected for porosity and multiplied by a factor between 4 and 6 was equal to or greater than 317 MPa. The tensile strength of nickel foam of the invention appears to be characterized by a factor of about 5.

The method of the invention provides an extremely flexible method of producing nickel foam having significantly improved properties for use as battery plaques. The invention has produced nickel foams with porosities as high as 99 percent. The method of the invention also facilitates the production of nickel of increased thickness, such as foams 10 cm thick or more. The invention has the ability to produce foams having pore sizes as low as 20 μm. As shown in FIG. 7 and 8, conductivity and tensile strength also are greatly improved with the invention. The nickel foam of the invention provides the above advantages over electrochemical nickel foam. These advantages indicate that nickel foam of the invention should significantly improve both battery plaque and battery performance. The nickel foam of the invention may also be used for other applications, such as high temperature filters.

While in accordance with the provisions of the statute, there is illustrated and described herein specific embodiments of the invention. Those skilled in the art will understand that changes may be made in the form of the invention covered by the claims and that certain features of the invention may sometimes be used to advantage without a corresponding use of the other features.

The embodiments of the invention in which an exclusive property or privilege is claimed are defined as follows:

1. A method of forming a nickel foam comprising:

placing an open-cell thermally decomposable foam structure in an atmosphere containing nickel carbonyl gas, heating said foam structure to a temperature at which said nickel carbonyl gas decomposes, decomposing nickel from said nickel carbonyl gas on said foam structure to form a nickel plated foam structure, and sintering said nickel plated foam structure to thermally decompose and remove said foam structure from said nickel plated foam structure leaving an open-cell nickel network of interconnected nickel wires to form said nickel foam.

2. The method of claim 1 additionally including the step of annealing said nickel foam to improve mechanical properties of said nickel foam.

3. The method of claim 1 wherein said open-cell foam structure is composed of a material selected from the group consisting of polyurethane, polystyrene, polyvinylchloride, polyethylene, polyisocyanurates, polyphenols and polypropylene.

4. The method of claim 1 wherein said open-cell foam structure is of polyurethane.

5. The method of claim 1 wherein said heating of said open-cell foam structure comprises irradiating said open-cell foam structure with infrared radiation.

6. The method of claim 1 including the additional step of adding a material which absorbs a band of infrared radiation that nickel carbonyl and carbon monoxide gases absorb inefficiently to said open-cell foam structure and wherein said coated open-cell foam structure is heated by irradiating with said band of infrared radiation said material absorbs and said nickel carbonyl and carbon monoxide gases absorb inefficiently.

7. The method of claim 6 wherein said material which absorbs a band of infrared radiation that nickel carbonyl and carbon monoxide gases absorb inefficiently comprises carbon black.

8. The method of claim 1 wherein said nickel carbonyl gas containing atmosphere contains from about 20 to about 90 percent nickel carbonyl and from about 10 to about 80 percent carbon monoxide by volume.

9. The method of claim 1 wherein said open-cell foam structure comprises elongated cells to increase conductivity in a desired direction.

* * * * *